(12) United States Patent
Chang et al.

(10) Patent No.: US 10,811,407 B2
(45) Date of Patent: Oct. 20, 2020

(54) MONOLITHIC INTEGRATION OF ENHANCEMENT MODE AND DEPLETION MODE FIELD EFFECT TRANSISTORS

(71) Applicant: WIN Semiconductors Corp., Tao Yuan (TW)

(72) Inventors: Chia-Ming Chang, Tao Yuan (TW); Jung-Tao Chung, Tao Yuan (TW); Yan-Cheng Lin, Tao Yuan (TW); Lung-Yi Tseng, Tao Yuan (TW)

(73) Assignee: WIN SEMICONDUCTOR CORP., Tao Yuan (TW)

( * ) Notice: Subject to any disclaimer, the term of this patent is extended or adjusted under 35 U.S.C. 154(b) by 0 days.

(21) Appl. No.: 16/266,864

(22) Filed: Feb. 4, 2019

(65) Prior Publication Data

US 2020/0251469 A1    Aug. 6, 2020

(51) Int. Cl.
| H01L 27/088 | (2006.01) |
| H01L 21/76 | (2006.01) |
| H01L 21/8234 | (2006.01) |
| H01L 27/06 | (2006.01) |

(52) U.S. Cl.
CPC ...... H01L 27/0883 (2013.01); H01L 21/7607 (2013.01); H01L 21/823456 (2013.01); H01L 27/0605 (2013.01)

(58) Field of Classification Search
CPC ............. H01L 27/0883; H01L 27/0605; H01L 21/7607; H01L 21/823456
See application file for complete search history.

(56) References Cited

U.S. PATENT DOCUMENTS

| 5,021,857 | A | * | 6/1991 | Suehiro | ............. | H01L 21/30621 |
| | | | | | | 257/194 |
| 6,222,210 | B1 | * | 4/2001 | Cerny | ................. | H01L 21/8252 |
| | | | | | | 257/194 |
| 6,670,652 | B2 | * | 12/2003 | Song | .................... | H01L 21/8252 |
| | | | | | | 257/11 |
| 2005/0110054 | A1 | * | 5/2005 | Wohlmuth | ...... | H01L 21/823456 |
| | | | | | | 257/267 |
| 2006/0027840 | A1 | * | 2/2006 | Wohlmuth | ........ | H01L 21/82345 |
| | | | | | | 257/267 |
| 2006/0175632 | A1 | * | 8/2006 | Hwang | ............... | H01L 27/0605 |
| | | | | | | 257/192 |

(Continued)

*Primary Examiner* — Joseph C. Nicely
(74) *Attorney, Agent, or Firm* — Muncy, Geissler, Olds & Lowe, P.C.

(57) ABSTRACT

A monolithic integration of enhancement mode (E-mode) and depletion mode (D-mode) field effect transistors (FETs) comprises a compound semiconductor substrate overlaid by an epitaxial structure overlaid by source and drain electrodes. The epitaxial structure includes from bottom to top sequentially a buffer layer, a channel layer, a Schottky barrier layer, a first etch stop layer, and a first cap layer. The respective first gate metal layers of the D-mode and E-mode FET are in contact with the first etch stop layer. The D-mode and E-mode gate-sinking regions are beneath the respective first gate metal layers of the D-mode and E-mode gate electrode at least within the first etch stop layer. The first gate metal layer material of the D-mode is the same as that of the E-mode, where the first gate metal layer thickness of the E-mode is greater than that of the D-mode.

20 Claims, 5 Drawing Sheets

(56) References Cited

U.S. PATENT DOCUMENTS

2010/0052013 A1\* 3/2010 Yoshinaga .......... H01L 29/7785
                                                    257/183
2014/0264431 A1\* 9/2014 Lal ..................... H01L 29/0619
                                                    257/121

\* cited by examiner

MONOLITHIC INTEGRATION OF ENHANCEMENT MODE AND DEPLETION MODE FIELD EFFECT TRANSISTORS

FIELD OF THE INVENTION

The present invention relates to monolithically integrated circuit devices, especially a monolithic integration of enhancement mode and depletion mode field effect transistors.

BACKGROUND OF THE INVENTION

The monolithic integration of enhancement mode (E-mode) and depletion mode (D-mode) field effect transistors (FETs) has been a crucial requirement for their widespread applications in digital circuits where ultra-high speed, low power consumption, and simpler circuit design methodologies are the priorities. Direct Coupled FET Logic (DCFL) device is one type of the high-speed logic circuits. In such application, a plurality of FETs with different threshold values is required, for example, a normally-off E-mode FET (positive pinch-off/threshold voltage) and a normally-on D-mode FET (negative pinch-off/threshold voltage) form on the same semiconductor substrate.

FIG. 7 discloses a conventional monolithically integrated E-mode and D-mode FET device 9. This particular example composed of a D-mode FET 97 and an E-mode FET 98 is integrated in a multi-layer structure. The multi-layer structure comprises a compound semiconductor substrate 90 that is made of GaAs, a buffer layer 91 that is made of GaAs and AlGaAs, a channel layer 92 that is made of InGaAs, a Schottky barrier layer 93 that is made of AlGaAs, an etch stop layer 94 that is made of InGaP, a first cap layer 95 that is made of AlGaAs, a second cap layer 96 that is made of InGaAs, an isolation region 99, a D-mode/E-mode gate recess 908/909, a D-mode source/drain electrode 901/902, an E-mode source/drain electrode 904/905, a D-mode/E-mode gate electrode 903/906, and a D-mode/E-mode ungated region 920/921. Each FET 97, 98 is electrically isolated by the isolation region 99. Note that the D-mode and E-mode gate electrodes 903, 906 are deposited directly on the exposed surface of the Schottky barrier layer 93, i.e., the respective gate electrodes 903, 906 of the D-mode and E-mode are in contact with the Schottky barrier layer 93. In this case, extra photolithography and etch steps are required to form the D-mode and E-mode gate recess 908, 909. This leads to additional cost and complexity in the FET fabrication process. Most importantly, the exposed surface of the Schottky barrier layer 93 causes surface states, especially on the D-mode/E-mode ungated region 920/921, which would degrade the FET noise performance and alter the transistor threshold/pinch-off voltage from the target value. Additionally, the metal layer deposited in contact with the exposed surface of the Schottky barrier layer 93 in the E-mode gate recess 909 is fully amorphized into the barrier layer while that in the D-mode gate recess 908 is not significantly amorphized into the barrier layer. These phenomena ambiguously indicate that the gate-sinking technique is only adopted in the E-mode FET 98 and the respective gate electrodes 903, 906 of the D-mode and E-mode FET 97, 98 should have different material for the first metal layer deposited in contact with the Schottky barrier layer 93.

FIG. 8 discloses another conventional monolithically integrated E-mode and D-mode FET device 9'. The multi-layer structure of the integrated E-mode and D-mode FET device 9' shown in FIG. 7 is basically the same as that of the integrated E-mode and D-mode FET device 9 shown in FIG. 8 except the D-mode gate recess 908', the D-mode gate electrode 903', and the D-mode ungated region 920'. In this conventional embodiment, the D-mode ungated region 920' is the first cap layer 95 while that of the E-mode ungated region 921 is the Schottky barrier layer 93. Although both of the D-mode and E-mode FETs 97', 98 are formed by using the gate-sinking technique, the conventional monolithic integrated E-mode and D-mode FET device 9' of FIG. 8 sacrifice the performance of the D-mode FET 97' in the breakdown voltage. The degradation of the breakdown voltage in the D-mode FET 97' hugely limits its applications as a power amplifier.

Accordingly, the present invention has developed a new design which may avoid the above mentioned drawbacks, may significantly enhance the performance of the devices, and may take into account economic considerations. Therefore, the present invention then has been invented.

SUMMARY OF THE INVENTION

In order to solve the above mentioned problems and achieve the expected transistor performances, the present invention provides methods of making monolithically integrated E-mode and D-mode FET devices. Such a device comprises a compound semiconductor substrate, an epitaxial structure, a D-mode source electrode, a D-mode drain electrode, a D-mode gate electrode, an E-mode source electrode, an E-mode drain electrode, and an E-mode gate electrode. The epitaxial structure forms on the compound semiconductor substrate. The epitaxial structure includes a D-mode part and an E-mode part. The epitaxial structure comprises a buffer layer, a channel layer, a Schottky barrier layer, a first etch stop layer, and a first cap layer. The buffer layer forms on the compound semiconductor substrate. The channel layer forms on the buffer layer. The Schottky barrier layer forms on the channel layer. The first etch stop layer forms on the Schottky barrier layer. The first cap layer forms on the first etch stop layer. The D-mode source electrode forms on one end of the D-mode part of the epitaxial structure. The D-mode drain electrode forms on the other end of the D-mode part of the epitaxial structure, wherein the D-mode part of the epitaxial structure has a D-mode gate recess located between the D-mode source electrode and the D-mode drain electrode, wherein a bottom of the D-mode gate recess is defined by the first etch stop layer. The D-mode gate electrode forms on the first etch stop layer within the D-mode gate recess, wherein the D-mode gate electrode comprises a D-mode first gate metal layer, wherein the D-mode first gate metal layer is in contact with the first etch stop layer. The E-mode source electrode forms on one end of the E-mode part of the epitaxial structure. The E-mode drain electrode forms on the other end of the E-mode part of the epitaxial structure, wherein the E-mode part of the epitaxial structure has an E-mode gate recess located between the E-mode source electrode and the E-mode drain electrode, wherein a bottom of the E-mode gate recess is defined by the first etch stop layer. The E-mode gate electrode forms on the first etch stop layer within the E-mode gate recess, wherein the E-mode gate electrode comprises an E-mode first gate metal layer, wherein the E-mode first gate metal layer is in contact with the first etch stop layer. The D-mode part of the epitaxial structure, the D-mode source electrode, the D-mode gate electrode, and the D-mode drain electrode form a D-mode FET. The E-mode part of the epitaxial structure, the E-mode source electrode, the E-mode gate electrode, and the E-mode drain electrode form an E-mode FET.

In a preferred embodiment, the epitaxial structure further comprises a second etch stop layer and a second cap layer, wherein the second etch stop layer forms on the first cap layer, wherein the second cap layer forms on the second etch stop layer, wherein the D-mode source electrode, the D-mode drain electrode, the E-mode source electrode, and the E-mode drain electrode form on the second cap layer.

In a preferred embodiment, the epitaxial structure further comprises an isolation region, wherein the isolation region locates between the D-mode part of the epitaxial structure and the E-mode part of the epitaxial structure.

The present invention further provides a monolithically integrated E-mode and D-mode FET device, comprising a compound semiconductor substrate, an epitaxial structure, a source electrode, a drain electrode, a D-mode gate electrode, and an E-mode gate electrode. The epitaxial structure forms on the compound semiconductor substrate. The epitaxial structure comprises a buffer layer, a channel layer, a Schottky barrier, a first etch stop layer, and a first cap layer. The buffer layer forms on the compound semiconductor substrate. The channel layer forms on the buffer layer. The Schottky barrier layer forms on the channel layer. The first etch stop layer forms on the Schottky barrier layer. The first cap layer forms on the first etch stop layer. The source electrode forms on one end of the epitaxial structure. The drain electrode forms on the other end of the epitaxial structure, wherein the epitaxial structure has a D-mode gate recess and an E-mode gate recess, wherein the D-mode gate recess locates between the source electrode and the drain electrode, wherein the E-mode gate recess locates between the source electrode and the D-mode gate recess or between the D-mode gate recess and the drain electrode, wherein a bottom of the D-mode gate recess is defined by the first etch stop layer, wherein a bottom of the E-mode gate recess is defined by the first etch stop layer. The D-mode gate electrode forms on the first etch stop layer within the D-mode gate recess, wherein the D-mode gate electrode comprises a D-mode first gate metal layer, wherein the D-mode first gate metal layer is in contact with the first etch stop layer. The E-mode gate electrode forms on the first etch stop layer within the E-mode gate recess, wherein the E-mode gate electrode comprises an E-mode first gate metal layer, wherein the E-mode first gate metal layer is in contact with the first etch stop layer.

In a preferred embodiment, the epitaxial structure further comprises a second etch stop layer and a second cap layer, wherein the second etch stop layer forms on the first cap layer, wherein the second cap layer forms on the second etch stop layer, wherein the source electrode and drain electrode form on the second cap layer.

In a preferred embodiment, the monolithically integrated E-mode and D-mode FET device further comprises a D-mode gate-sinking region and an E-mode gate-sinking region, wherein the D-mode gate-sinking region is beneath the D-mode first gate metal layer of the D-mode gate electrode at least within the first etch stop layer; while the E-mode gate-sinking region is beneath the E-mode first gate metal layer of the E-mode gate electrode at least within the first etch stop layer.

In a preferred embodiment, the depth of the E-mode gate-sinking region is greater than the depth of the D-mode gate-sinking region.

In a preferred embodiment, the D-mode first gate metal layer of the D-mode gate electrode includes at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rodium (Ro), tantalum (Ta), tantalum nitride (TaN), aluminum (Al), and rhenium (Re); wherein the E-mode first gate metal layer of the E-mode gate electrode includes at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rodium (Ro), tantalum (Ta), tantalum nitride (TaN), aluminum (Al), and rhenium (Re).

In a preferred embodiment, the material of the D-mode first gate metal layer is different from the material of the E-mode first gate metal layer.

In a preferred embodiment, the material of the D-mode first gate metal layer is the same as the material of the E-mode first gate metal layer.

In a preferred embodiment, the thickness of the E-mode first gate metal layer is greater than the thickness of the D-mode first gate metal layer.

In a preferred embodiment, the second etch stop layer includes at least one of InGaP, InGaAsP, InAlGaP, and AlAs.

In a preferred embodiment, the second cap layer is made of GaAs.

In a preferred embodiment, the first cap layer is made of GaAs.

In a preferred embodiment, the first etch stop layer is made of InGaP, InGaAsP, or InAlGaP.

In a preferred embodiment, the Schottky barrier layer is made of AlGaAs.

In a preferred embodiment, the channel layer is made of InGaAs.

In a preferred embodiment, the buffer layer includes at least one of GaAs and AlGaAs.

In a preferred embodiment, the compound semiconductor substrate is made of GaAs.

The details of one or more embodiments of the invention are set forth in the accompanying drawings and the description below. Other features, objects, and advantages of the invention will be apparent from the description, drawings, and claims.

DETAILED DESCRIPTIONS OF PREFERRED EMBODIMENTS

Figure 1:
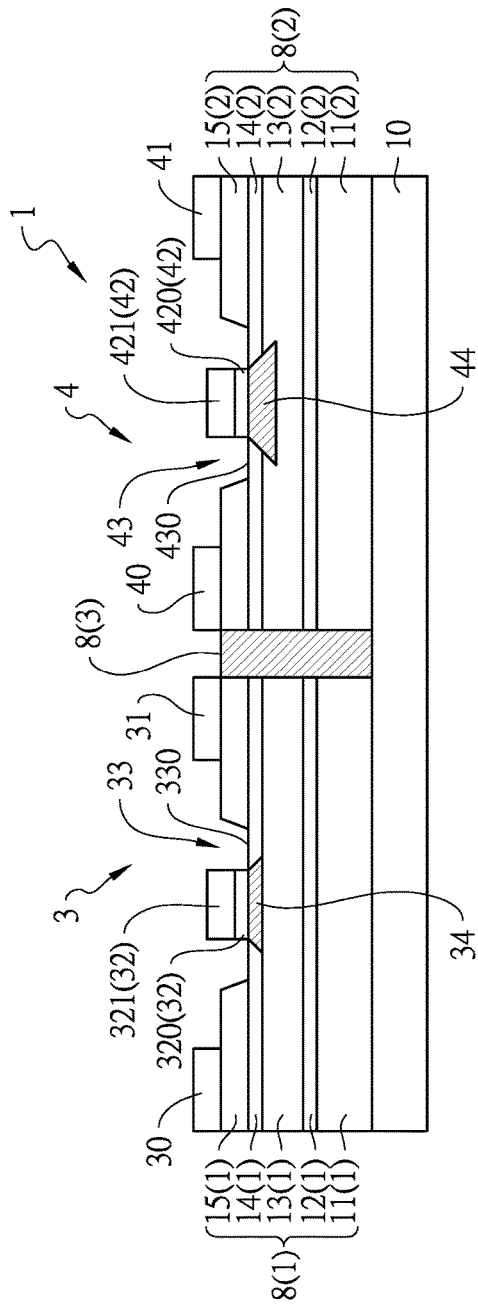
FIG. 1 is a cross-sectional side view of an embodiment of a monolithic integration of E-mode and D-mode FETs of the present invention.

FIG. 1 shows an embodiment of a monolithic integration of E-mode and D-mode FETs of the present invention. A monolithic integration 1 of E-mode and D-mode FETs shown in FIG. 1 comprises a compound semiconductor substrate 10, an epitaxial structure 8, a D-mode source electrode 30, a D-mode drain electrode 31, a D-mode gate electrode 32, an E-mode source electrode 40, an E-mode drain electrode 41, and an E-mode gate electrode 42. The compound semiconductor substrate 10 is made of GaAs. The epitaxial structure 8 forms on the compound semiconductor substrate 10. The epitaxial structure 8 includes a D-mode part 8(1), an isolation region 8(3), and an E-mode part 8(2). The epitaxial structure 8 comprises a buffer layer 11, a channel layer 12, a Schottky barrier layer 13, a first etch stop layer 14, and a first cap layer 15. The buffer layer 11 forms on the compound semiconductor substrate 10. The buffer layer 11 includes at least one of GaAs and AlGaAs. The channel layer 12 forms on the buffer layer 11. The channel layer 12 includes at least one of InGaAs and GaAs. The Schottky barrier layer 13 forms on the channel layer 12. The Schottky barrier layer 13 includes at least one of GaAs and AlGaAs. The first etch stop layer 14 forms on the Schottky barrier layer 13. The first etch stop layer 14 includes at least one of InGaP, InGaAsP and InAlGaP. The first cap layer 15 forms on the first etch stop layer 14. The first cap layer 15 is made of GaAs. The D-mode source electrode 30 forms on one end of the D-mode part 8(1) of the epitaxial structure 8. The D-mode drain electrode 31 forms on the other end of the D-mode part 8(1) of the epitaxial structure 8. The D-mode part 8(1) of the epitaxial structure 8 has a D-mode gate recess 33 located between the D-mode source electrode 30 and the D-mode drain electrode 31. A bottom 330 of the D-mode gate recess 33 is defined by the first etch stop layer 14. The D-mode gate electrode 32 forms on the first etch stop layer 14 within the D-mode gate recess 33. The D-mode gate electrode 32 comprises a D-mode first gate metal layer 320 and at least one D-mode second gate metal layer 321. The D-mode first gate metal layer 320 which forms on the first etch stop layer 14 is in contact with the first etch stop layer 14. The D-mode second gate metal layer 321 forms on the D-mode first gate metal layer 320. In some embodiments, the D-mode first gate metal layer 320 of the D-mode gate electrode 32 includes at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rodium (Ro), tantalum (Ta), tantalum nitride (TaN), aluminum (Al), and rhenium (Re). The D-mode part 8(1) of the epitaxial structure 8, the D-mode source electrode 30, the D-mode gate electrode 32, and the D-mode drain electrode 31 form a D-mode FET 3. The D-mode FET 3 comprises a D-mode gate-sinking region 34. The D-mode gate-sinking region 34 is beneath the D-mode first gate metal layer 320 of the D-mode gate electrode 32 at least within the first etch stop layer 14. In some preferable embodiments, the D-mode gate-sinking region 34 is beneath the D-mode first gate metal layer 320 of the D-mode gate electrode 32 within the first etch stop layer 14. In some other embodiments, the D-mode gate-sinking region 34 is beneath the D-mode first gate metal layer 320 of the D-mode gate electrode 32, through the first etch stop layer 14, and within the Schottky barrier layer 13. The E-mode source electrode 40 forms on one end of the E-mode part 8(2) of the epitaxial structure 8. The E-mode drain electrode 41 forms on the other end of the E-mode part 8(2) of the epitaxial structure 8. The E-mode part 8(2) of the epitaxial structure 8 has an E-mode gate recess 43 located between the E-mode source electrode 40 and the E-mode drain electrode 41. A bottom 430 of the E-mode gate recess 43 is defined by the first etch stop layer 14. The E-mode gate electrode 42 forms on the first etch stop layer 14 within the E-mode gate recess 43. The E-mode gate electrode 42 comprises an E-mode first gate metal layer 420 and at least one E-mode second gate metal layer 421. The E-mode first gate metal layer 420 which forms on the first etch stop layer 14 is in contact with the first etch stop layer 14. The E-mode second gate metal layer 421 forms on the E-mode first gate metal layer 420. In some embodiments, the E-mode first gate metal layer 420 of the E-mode gate electrode 42 includes at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rodium (Ro), tantalum (Ta), tantalum nitride (TaN), aluminum (Al), and rhenium (Re). The E-mode part 8(2) of the epitaxial structure 8, the E-mode source electrode 40, the E-mode gate electrode 42, and the E-mode drain electrode 41 form an E-mode FET 4. The E-mode FET 4 comprises an E-mode gate-sinking region 44. The E-mode gate-sinking region 44 is beneath the E-mode first gate metal layer 420 of the E-mode gate electrode 42 at least within the first etch stop layer 14. In some embodiments, the E-mode gate-sinking region 44 is beneath the E-mode first gate metal layer 420 of the E-mode gate electrode 42 within the first etch stop layer 14. In some preferable embodiments, the E-mode gate-sinking region 44 is beneath the E-mode first gate metal layer 420 of the E-mode gate electrode 42, through the first etch stop layer 14, and within the Schottky barrier layer 13. In some preferable embodiments, the depth of the E-mode gate-sinking region 44 is greater than the depth of the D-mode gate-sinking region 34. The isolation region 8(3) of the epitaxial structure 8 sits between the D-mode part 8(1) of the epitaxial structure 8 and the E-mode part 8(2) of the epitaxial structure 8. Therefore, the D-mode FET 3 and E-mode FET 4 are electrically isolated by the isolation region 8(3) of the epitaxial structure 8.

In some embodiments, the material of the D-mode first gate metal layer 320 of the D-mode gate electrode 32 is different from the material of the E-mode first gate metal layer 420 of the E-mode gate electrode 42.

In some embodiments, the material of the D-mode first gate metal layer 320 of the D-mode gate electrode 32 is the same as the material of the E-mode first gate metal layer 420 of the E-mode gate electrode 42, wherein the thickness of the E-mode first gate metal layer 420 of the E-mode gate electrode 42 is greater than the thickness of the D-mode first gate metal layer 320 of the D-mode gate electrode 32.

Figure 2:
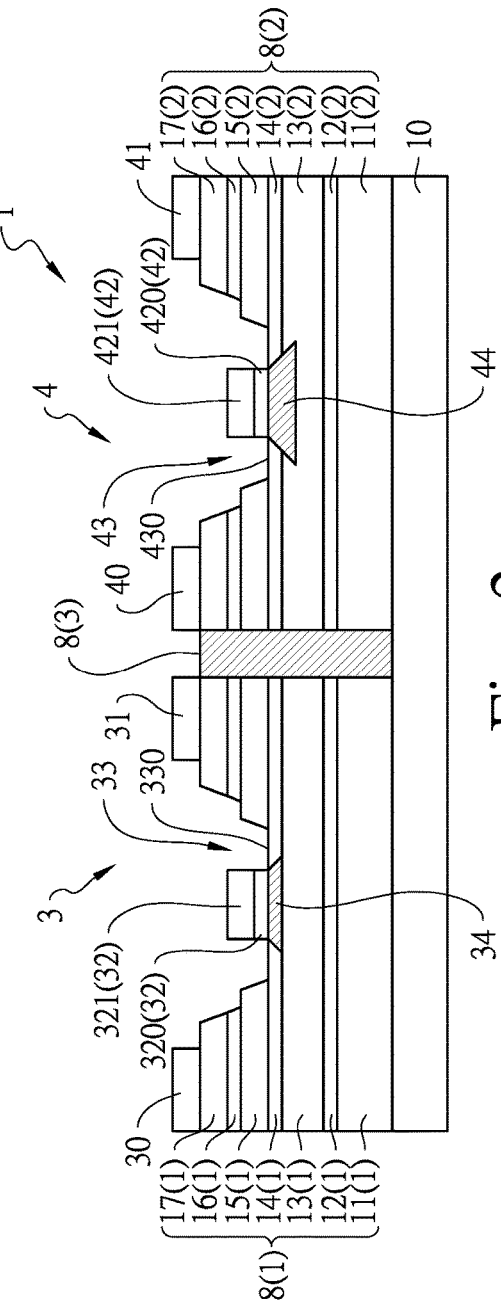
FIG. 2 is a cross-sectional side view of another embodiment of a monolithic integration of E-mode and D-mode FETs of the present invention.

FIG. 2 shows another embodiment of a monolithic integration of E-mode and D-mode FETs of the present invention. The main structure of the embodiment shown in FIG. 2 is basically the same as the structure of the embodiment shown in FIG. 1, except that the epitaxial structure 8 further comprises a second etch stop layer 16 and a second cap layer 17. The second etch stop layer 16 forms on the first cap layer 15. The second etch stop layer 16 includes at least one of InGaP, InGaAsP, InAlGaP, and AlAs. The second cap layer 17 forms on the second etch stop layer 16, wherein the D-mode source electrode 30, the D-mode drain electrode 31, the E-mode source electrode 40, and the E-mode drain electrode 41 form on the second cap layer 17. The second cap layer 17 is made of GaAs.

Figure 3:
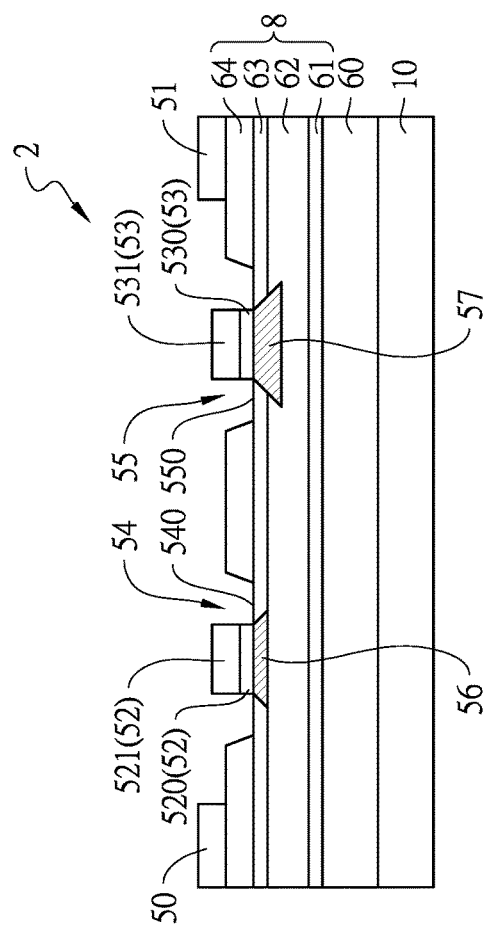
FIG. 3 is a cross-sectional side view of another embodiment of a monolithic integration of E-mode and D-mode FETs of the present invention.

FIG. 3 shows another embodiment of a monolithic integration of E-mode and D-mode FETs of the present invention. A monolithic integration 2 of E-mode and D-mode FETs comprises a compound semiconductor substrate 10, an epitaxial structure 8, a source electrode 50, a drain electrode 51, a D-mode gate electrode 52, and an E-mode gate electrode 53. The compound semiconductor substrate 10 is made of GaAs. The epitaxial structure 8 forms on the compound semiconductor substrate 10. The epitaxial structure 8 comprises a buffer layer 60, a channel layer 61, a Schottky barrier layer 62, a first etch stop layer 63, and a first cap layer 64. The buffer layer 60 forms on the compound semiconductor substrate 10. The buffer layer 60 includes at least one of GaAs and AlGaAs. The channel layer 61 forms on the buffer layer 60. The channel layer 61 includes at least one of InGaAs and GaAs. The Schottky barrier layer 62 forms on the channel layer 61. The Schottky barrier layer 62 is made of AlGaAs. The first etch stop layer 63 forms on the Schottky barrier layer 62. The first etch stop layer 63 includes at least one of InGaP, InAlGaP, and InGaAsP. The first cap layer 64 forms on the first etch stop layer 63. The first cap layer 64 is made of GaAs. The source electrode 50 forms on one end of the epitaxial structure 8. The drain electrode 51 forms on the other end of the epitaxial structure 8. The epitaxial structure 8 has a D-mode gate recess 54 and an E-mode gate recess 55. The D-mode gate recess 54 sits between the source electrode 50 and the E-mode gate recess 55. The E-mode gate recess 55 sits between the D-mode gate recess 54 and the drain electrode 51. A bottom 540 of the D-mode gate recess 54 is defined by the first etch stop layer 63. A bottom 550 of the E-mode gate recess 55 is defined by the first etch stop layer 63. The D-mode gate electrode 52 forms on the first etch stop layer 63 within the D-mode gate recess 54. The D-mode gate electrode 52 comprises a D-mode first gate metal layer 520 and at least one D-mode second gate metal layer 521. The D-mode first gate metal layer 520 which forms on the first etch stop layer 63 is in contact with the first etch stop layer 63. The D-mode second gate metal layer 521 forms on the D-mode first gate metal layer 520. In some embodiments, the D-mode first gate metal layer 520 of the D-mode gate electrode 52 includes at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rodium (Ro), tantalum (Ta), tantalum nitride (TaN), aluminum (Al), and rhenium (Re). A D-mode gate-sinking region 56 is beneath the D-mode first gate metal layer 520 of the D-mode gate electrode 52 at least within the first etch stop layer 63. The E-mode gate electrode 53 forms on the first etch stop layer 63 within the E-mode gate recess 55. The E-mode gate electrode 53 comprises an E-mode first gate metal layer 530 and at least one E-mode second gate metal layer 531. The E-mode first gate metal layer 530 which forms on the first etch stop layer 63 is in contact with the first etch stop layer 63. The E-mode second gate metal layer 531 forms on the E-mode first gate metal layer 530. In some embodiments, the E-mode first gate metal layer 530 of the E-mode gate electrode 53 includes at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rodium (Ro), tantalum (Ta), tantalum nitride (TaN), aluminum (Al), and rhenium (Re). An E-mode gate-sinking region 57 is beneath the E-mode first gate metal layer 530 of the E-mode gate electrode 53 at least within the first etch stop layer 63. In current embodiment, the monolithic integration 2 of E-mode and D-mode FETs is an enhancement/depletion (E/D) dual-gate FET. In some embodiments, the depth of the E-mode gate-sinking region 57 is greater than the depth of the D-mode gate-sinking region 56.

In some embodiments, the material of the D-mode first gate metal layer 520 of the D-mode gate electrode 52 is different from the material of the E-mode first gate metal layer 530 of the E-mode gate electrode 53.

In some embodiments, the material of the D-mode first gate metal layer 520 of the D-mode gate electrode 52 is the same as the material of the E-mode first gate metal layer 530 of the E-mode gate electrode 53, wherein the thickness of the E-mode first gate metal layer 530 of the E-mode gate electrode 53 is greater than the thickness of the D-mode first gate metal layer 520 of the D-mode gate electrode 52.

Figure 4:
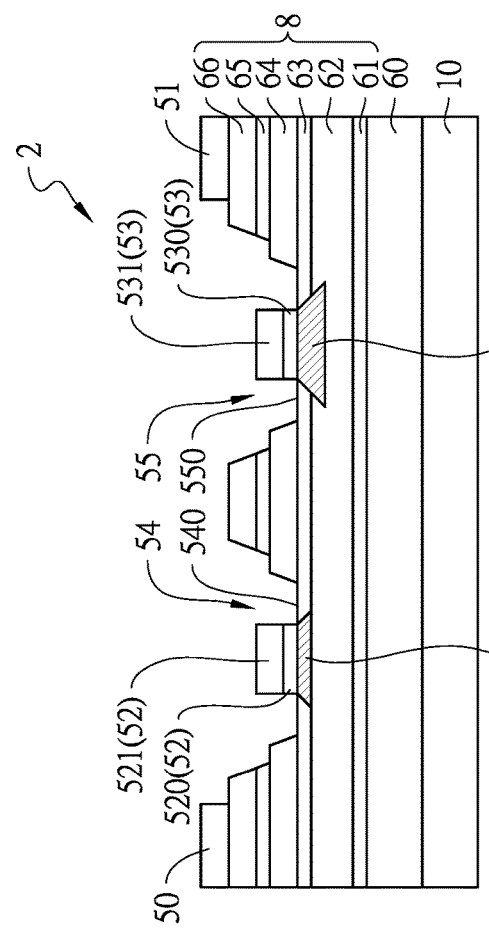
FIG. 4 is a cross-sectional side view of another embodiment of a monolithic integration of E-mode and D-mode FETs of the present invention.

FIG. 4 shows another embodiment of a monolithic integration of E-mode and D-mode FETs of the present invention. The main structure of the embodiment shown in FIG. 4 is basically the same as the structure of the embodiment shown in FIG. 3, except that the epitaxial structure 8 further comprises a second etch stop layer 65 and a second cap layer 66. The second etch stop layer 65 forms on the first cap layer 64. The second etch stop layer 65 includes at least one of InGaP, InGaAsP, InAlGaP, and AlAs. The second cap layer 66 forms on the second etch stop layer 65, wherein the source electrode 50 and the drain electrode 51 form on the second cap layer 66. The second cap layer 66 is made of GaAs.

Figure 5:
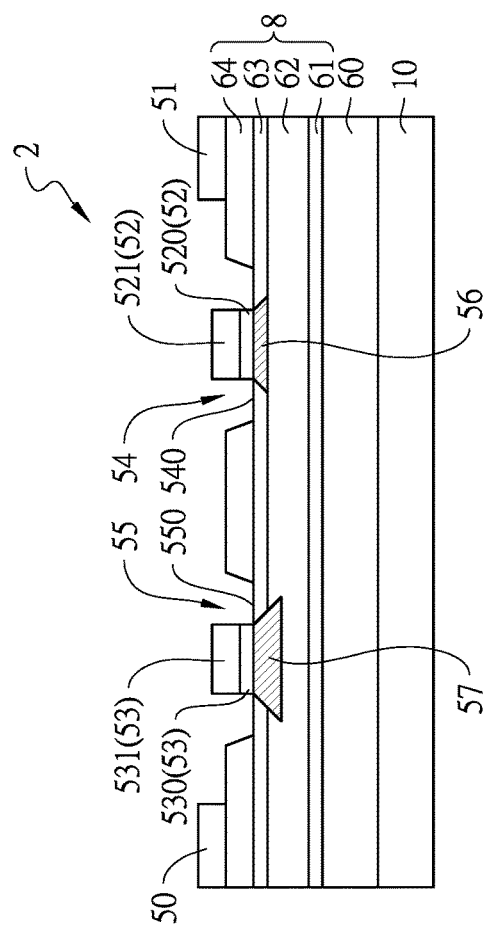
FIG. 5 is a cross-sectional side view of another embodiment of a monolithic integration of E-mode and D-mode FETs of the present invention.

FIG. 5 shows another embodiment of a monolithic integration of E-mode and D-mode FETs of the present invention. The main structure of the embodiment shown in FIG. 5 is basically the same as the structure of the embodiment shown in FIG. 3, except that the D-mode gate recess 54 sits between the drain electrode 51 and the E-mode gate recess 55; while the E-mode gate recess 55 sits between the D-mode gate recess 54 and the source electrode 50. The bottom 540 of the D-mode gate recess 54 is defined by the first etch stop layer 63. The bottom 550 of the E-mode gate recess 55 is defined by the first etch stop layer 63. The D-mode first gate metal layer 520 which forms on the first etch stop layer 63 is in contact with the first etch stop layer 63. The D-mode gate-sinking region 56 is beneath the D-mode first gate metal layer 520 of the D-mode gate electrode 52 at least within the first etch stop layer 63. The E-mode first gate metal layer 530 which forms on the first etch stop layer 63 is in contact with the first etch stop layer 63. The E-mode gate-sinking region 57 is beneath the E-mode first gate metal layer 530 of the E-mode gate electrode 53 at least within the first etch stop layer 63.

Figure 6:
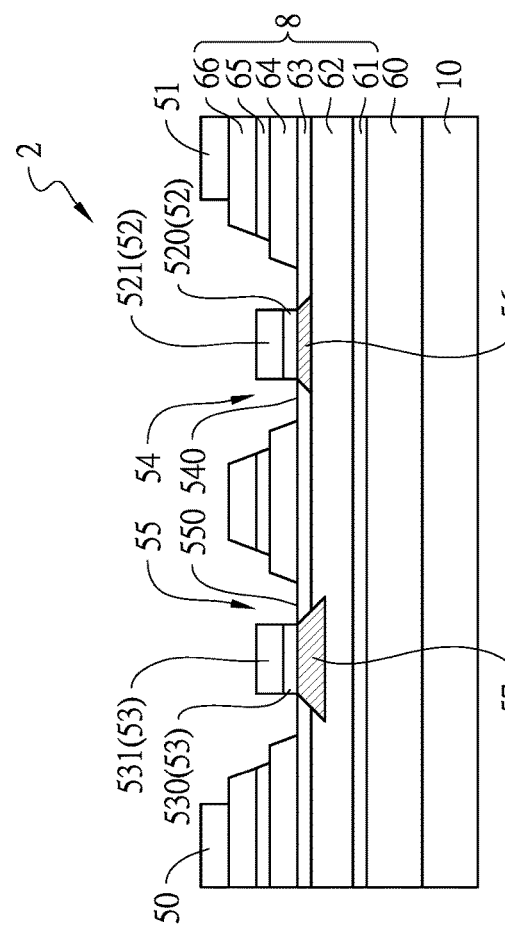
FIG. 6 is a cross-sectional side view of another embodiment of a monolithic integration of E-mode and D-mode FETs of the present invention.
Figure 7:
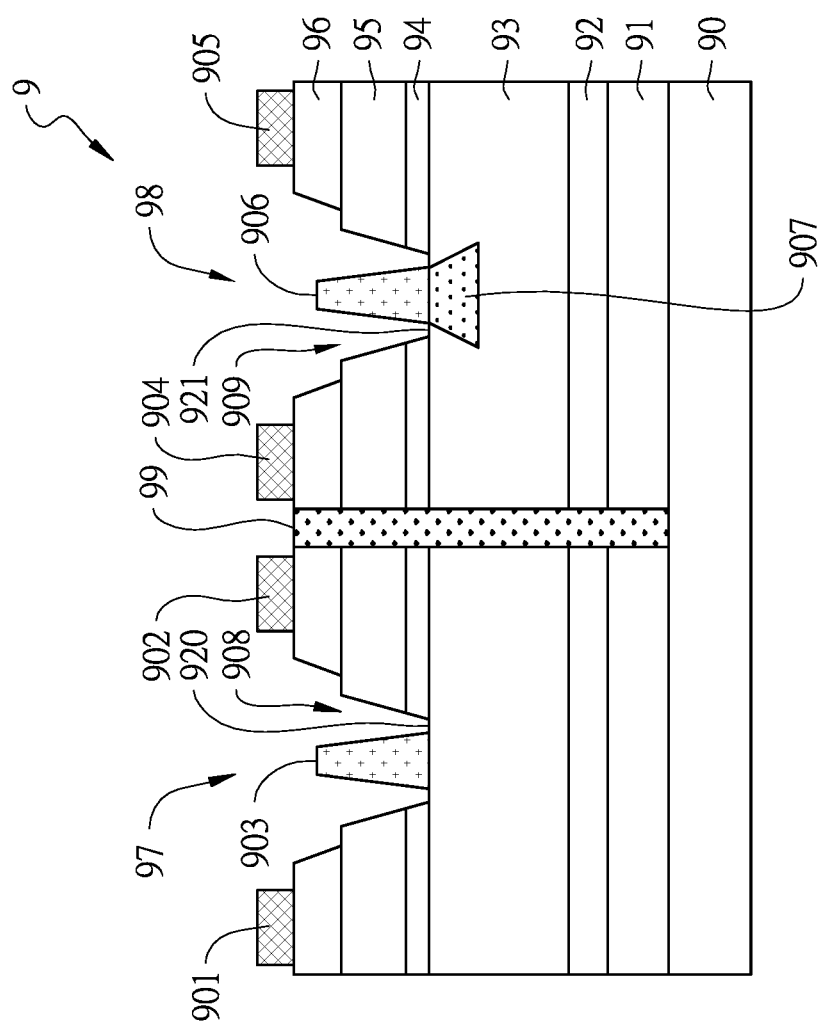
FIG. 7 is a cross-sectional side view of a conventional embodiment of a monolithic integration of E-mode and D-mode FETs.
Figure 8:
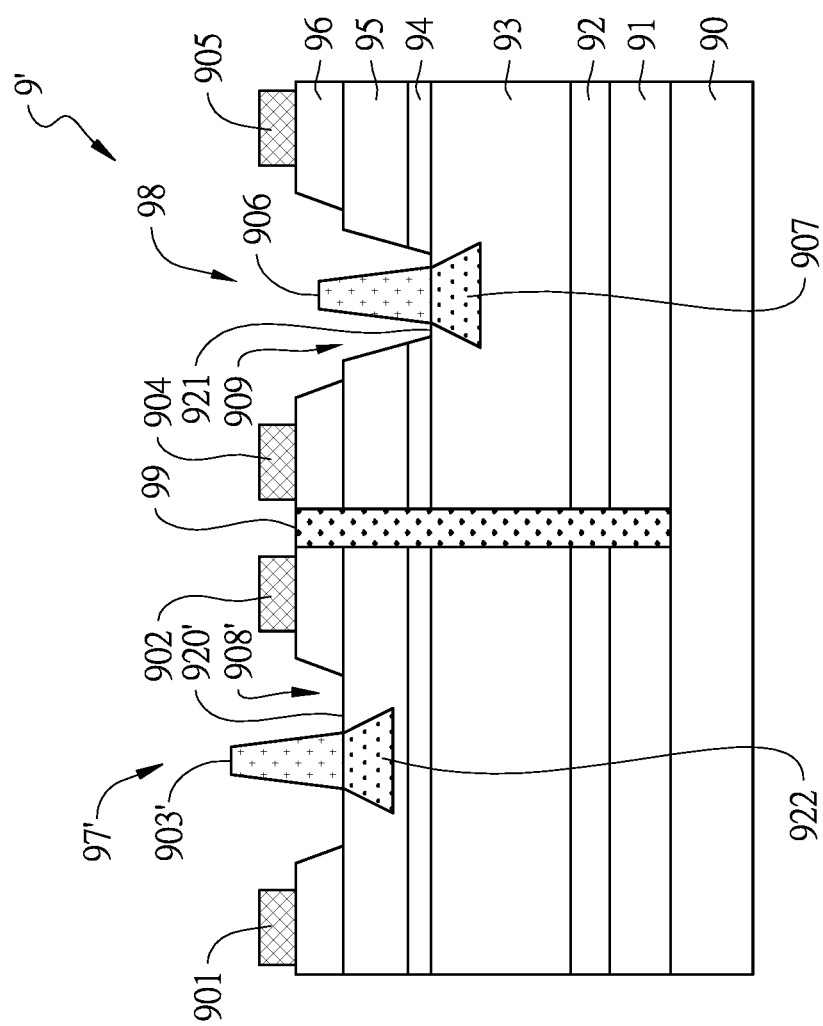
FIG. 8 is a cross-sectional side view of another conventional embodiment of a monolithic integration of E-mode and D-mode FETs.

FIG. 6 shows another embodiment of a monolithic integration of E-mode and D-mode FETs of the present invention. The main structure of the embodiment shown in FIG. 6 is basically the same as the structure of the embodiment shown in FIG. 4, except that the D-mode gate recess 54 sits between the drain electrode 51 and the E-mode gate recess 55; while the E-mode gate recess 55 sits between the D-mode gate recess 54 and the source electrode 50. The bottom 540 of the D-mode gate recess 54 is defined by the first etch stop layer 63. The bottom 550 of the E-mode gate recess 55 is defined by the first etch stop layer 63. The D-mode first gate metal layer 520 which forms on the first etch stop layer 63 is in contact with the first etch stop layer 63. The D-mode gate-sinking region 56 is beneath the D-mode first gate metal layer 520 of the D-mode gate electrode 52 at least within the first etch stop layer 63. The E-mode first gate metal layer 530 which forms on the first etch stop layer 63 is in contact with the first etch stop layer 63. The E-mode gate-sinking region 57 is beneath the E-mode first gate metal layer 530 of the E-mode gate electrode 53 at least within the first etch stop layer 63.

As disclosed in the above description and attached drawings, the present invention can provide a monolithic integration of E-mode and D-mode FETs. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A monolithic integration of E-mode and D-mode FETs comprising:
    a compound semiconductor substrate;
    an epitaxial structure formed on said compound semiconductor substrate, wherein said epitaxial structure includes a D-mode part and an E-mode part, wherein said epitaxial structure comprises:
        a buffer layer formed on said compound semiconductor substrate;
        a channel layer formed on said buffer layer;
        a Schottky barrier layer formed on said channel layer;
        a first etch stop layer formed on said Schottky barrier layer; and
        a first cap layer formed on said first etch stop layer;
    a D-mode source electrode formed on one end of said D-mode part of said epitaxial structure;
    a D-mode drain electrode formed on the other end of said D-mode part of said epitaxial structure, wherein said D-mode part of said epitaxial structure has a D-mode gate recess located between said D-mode source electrode and said D-mode drain electrode, wherein a bottom of said D-mode gate recess is defined by said first etch stop layer;
    a D-mode gate electrode formed on said first etch stop layer within said D-mode gate recess, wherein said D-mode gate electrode comprises a D-mode first gate metal layer, wherein said D-mode first gate metal layer is in contact with said first etch stop layer;
    a D-mode gate-sinking region, wherein said D-mode gate-sinking region is beneath said D-mode first gate metal layer of said D-mode gate electrode at least within said first etch stop layer;
    an E-mode source electrode formed on one end of said E-mode part of said epitaxial structure;
    an E-mode drain electrode formed on the other end of said E-mode part of said epitaxial structure, wherein said E-mode part of said epitaxial structure has an E-mode gate recess located between said E-mode source electrode and said E-mode drain electrode, wherein a bottom of said E-mode gate recess is defined by said first etch stop layer;
    an E-mode gate electrode formed on said first etch stop layer within said E-mode gate recess, wherein said E-mode gate electrode comprises an E-mode first gate metal layer, wherein said E-mode first gate metal layer is in contact with said first etch stop layer; and
    an E-mode gate-sinking region, wherein said E-mode gate-sinking region is beneath said E-mode first gate metal layer of said E-mode gate electrode at least within said first etch stop layer, wherein a depth of said E-mode gate-sinking region is greater than a depth of said D-mode gate-sinking region;
    wherein said D-mode part of said epitaxial structure, said D-mode source electrode, said D-mode gate electrode, and said D-mode drain electrode form a D-mode FET; while said E-mode part of said epitaxial structure, said E-mode source electrode, said E-mode gate electrode, and said E-mode drain electrode form an E-mode FET.

2. The monolithic integration of E-mode and D-mode FETs according to claim 1, wherein said D-mode first gate metal layer of said D-mode gate electrode includes at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rodium (Ro), tantalum (Ta), tantalum nitride (TaN), aluminum (Al), and rhenium (Re); wherein said E-mode first gate metal layer of said E-mode gate electrode includes at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rodium (Ro), tantalum (Ta), tantalum nitride (TaN), aluminum (Al), and rhenium (Re).

3. The monolithic integration of E-mode and D-mode FETs according to claim 2, wherein the material of said D-mode first gate metal layer is different from the material of said E-mode first gate metal layer.

4. The monolithic integration of E-mode and D-mode FETs according to claim 2, wherein the material of said D-mode first gate metal layer is the same as the material of said E-mode first gate metal layer.

5. The monolithic integration of E-mode and D-mode FETs according to claim 4, wherein a thickness of said E-mode first gate metal layer is greater than a thickness of said D-mode first gate metal layer.

6. The monolithic integration of E-mode and D-mode FETs according to claim 1, further comprising an isolation region between said D-mode part of said epitaxial structure and said E-mode part of said epitaxial structure.

7. The monolithic integration of E-mode and D-mode FETs according to claim 1, wherein said first cap layer is made of GaAs.

8. The monolithic integration of E-mode and D-mode FETs according to claim 1, wherein said first etch stop layer is made of InGaP, InGaAsP, or InAlGaP.

9. The monolithic integration of E-mode and D-mode FETs according to claim 1, wherein said Schottky barrier layer is made of AlGaAs.

10. The monolithic integration of E-mode and D-mode FETs according to claim 1, wherein said channel layer is made of InGaAs.

11. The monolithic integration of E-mode and D-mode FETs according to claim 1, wherein said compound semiconductor substrate is made of GaAs.

12. A monolithic integration of E-mode and D-mode FETs comprising:
    a compound semiconductor substrate;
    an epitaxial structure formed on said compound semiconductor substrate, wherein said epitaxial structure includes a D-mode part and an E-mode part, wherein said epitaxial structure comprises:
        a buffer layer formed on said compound semiconductor substrate;
        a channel layer formed on said buffer layer;
        a Schottky barrier layer formed on said channel layer;

a first etch stop layer formed on said Schottky barrier layer;
a first cap layer formed on said first etch stop layer;
a second etch stop layer formed on said first cap layer; and
a second cap layer formed on said second etch stop layer;
a D-mode source electrode formed on one end of said D-mode part of said epitaxial structure;
a D-mode drain electrode formed on the other end of said D-mode part of said epitaxial structure, wherein said D-mode part of said epitaxial structure has a D-mode gate recess located between said D-mode source electrode and said D-mode drain electrode, wherein a bottom of said D-mode gate recess is defined by said first etch stop layer, wherein said D-mode source electrode and said D-mode drain electrode are formed on said second cap layer;
a D-mode gate electrode formed on said first etch stop layer within said D-mode gate recess, wherein said D-mode gate electrode comprises a D-mode first gate metal layer, wherein said D-mode first gate metal layer is in contact with said first etch stop layer;
an E-mode source electrode formed on one end of said E-mode part of said epitaxial structure;
an E-mode drain electrode formed on the other end of said E-mode part of said epitaxial structure, wherein said E-mode part of said epitaxial structure has an E-mode gate recess located between said E-mode source electrode and said E-mode drain electrode, wherein a bottom of said E-mode gate recess is defined by said first etch stop layer, wherein said E-mode source electrode and said E-mode drain electrode are formed on said second cap layer; and
an E-mode gate electrode formed on said first etch stop layer within said E-mode gate recess, wherein said E-mode gate electrode comprises an E-mode first gate metal layer, wherein said E-mode first gate metal layer is in contact with said first etch stop layer;
wherein said D-mode part of said epitaxial structure, said D-mode source electrode, said D-mode gate electrode, and said D-mode drain electrode form a D-mode FET; while said E-mode part of said epitaxial structure, said E-mode source electrode, said E-mode gate electrode, and said E-mode drain electrode form an E-mode FET.

13. The monolithic integration of E-mode and D-mode FETs according to claim 12, wherein said second etch stop layer includes at least one of InGaP, InGaAsP, InAlGaP, and AlAs.

14. The monolithic integration of E-mode and D-mode FETs according to claim 12, wherein said second cap layer is made of GaAs.

15. The monolithic integration of E-mode and D-mode FETs according to claim 12, further comprising a D-mode gate-sinking region and an E-mode gate-sinking region, wherein said D-mode gate-sinking region is beneath said D-mode first gate metal layer of said D-mode gate electrode at least within said first etch stop layer; while said E-mode gate-sinking region is beneath said E-mode first gate metal layer of said E-mode gate electrode at least within said first etch stop layer.

16. The monolithic integration of E-mode and D-mode FETs according to claim 15, wherein a depth of said E-mode gate-sinking region is greater than a depth of said D-mode gate-sinking region.

17. The monolithic integration of E-mode and D-mode FETs according to claim 12, wherein said D-mode first gate metal layer of said D-mode gate electrode includes at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rodium (Ro), tantalum (Ta), tantalum nitride (TaN), aluminum (Al), and rhenium (Re); wherein said E-mode first gate metal layer of said E-mode gate electrode includes at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rodium (Ro), tantalum (Ta), tantalum nitride (TaN), aluminum (Al), and rhenium (Re).

18. The monolithic integration of E-mode and D-mode FETs according to claim 12, wherein the material of said D-mode first gate metal layer is different from the material of said E-mode first gate metal layer.

19. The monolithic integration of E-mode and D-mode FETs according to claim 12, wherein the material of said D-mode first gate metal layer is the same as the material of said E-mode first gate metal layer.

20. The monolithic integration of E-mode and D-mode FETs according to claim 19, wherein a thickness of said E-mode first gate metal layer is greater than a thickness of said D-mode first gate metal layer.

* * * * *